United States Patent [19]
Nakatsuka et al.

[11] Patent Number: 5,608,750
[45] Date of Patent: Mar. 4, 1997

[54] SEMICONDUCTOR LASER DEVICE AND A METHOD FOR THE MANUFACTURE THEREOF

[75] Inventors: Shinichi Nakatsuka, Hino; Kenji Uchida, Hachioji; Misuzu Sagawa; Satoru Kikuchi, both of Kokubunji, all of Japan

[73] Assignee: Hitachi, Ltd., Tokyo, Japan

[21] Appl. No.: 282,312

[22] Filed: Jul. 29, 1994

[30] Foreign Application Priority Data

Jul. 29, 1993 [JP] Japan ................................. 5-187806

[51] Int. Cl.⁶ ................................................. H01S 3/19
[52] U.S. Cl. ................................. 372/45; 372/46
[58] Field of Search ............................ 372/43, 45, 46

[56] References Cited

U.S. PATENT DOCUMENTS

| | | | |
|---|---|---|---|
| 4,270,096 | 5/1981 | Hayashi et al. | 372/46 |
| 5,212,704 | 5/1993 | Chen et al. | 372/45 |
| 5,280,535 | 1/1994 | Gfeller et al. | 372/46 |
| 5,296,717 | 3/1994 | Valster et al. | 372/45 |

FOREIGN PATENT DOCUMENTS

| | | | |
|---|---|---|---|
| 58-58784 | 4/1983 | Japan . | |
| 61-166087 | 7/1986 | Japan | 372/43 |
| 61-183986 | 8/1986 | Japan | 372/45 |
| 63-216396 | 9/1988 | Japan . | |
| 64-86585 | 3/1989 | Japan . | |
| 1-283893 | 11/1989 | Japan | 372/43 |
| 2-159082 | 6/1990 | Japan | 372/45 |
| 2-203586 | 8/1990 | Japan | 372/45 |
| 4-28280 | 1/1992 | Japan | 372/43 |
| 4-179179 | 6/1992 | Japan | 372/45 |
| 6-77607 | 3/1994 | Japan | 372/45 |

OTHER PUBLICATIONS

John A. F. Peek, "Water Vapor, Facet Erosion, and the Degradation of (Al,Ga)As DH Lasers Operated at CW Output Powers of Up to 3 mW/μ Stripewidth", IEEE Journal of Quantum Electronics, vol. QE–17, No. 5, May 1981, pp. 781–787.

Primary Examiner—Rodney B. Bovernick
Assistant Examiner—Yisun Song
Attorney, Agent, or Firm—Antonelli, Terry, Stout & Kraus, LLP

[57] ABSTRACT

A semiconductor laser device is provided which is designed to prevent end surface optical damage, thereby permitting an increase in the output of the semiconductor laser. To achieve this, an active layer at the light emitting end surface portion of the semiconductor laser device is recessed inwardly by a distance between 50 nm and 300 nm (depending on the amount of etching) from the end surfaces of the crystal layers lying on both sides of the active layer. The recess serves to improve the heat dissipation of the active layer portion. This results in improving the amount of light output of the semiconductor laser which is possible without causing optical damage. A method for making the device is also provided. This method permits achieving the above-noted advantages simply by adding an etching step to the conventional semiconductor laser fabrication process, without requiring special equipment or technique.

2 Claims, 10 Drawing Sheets

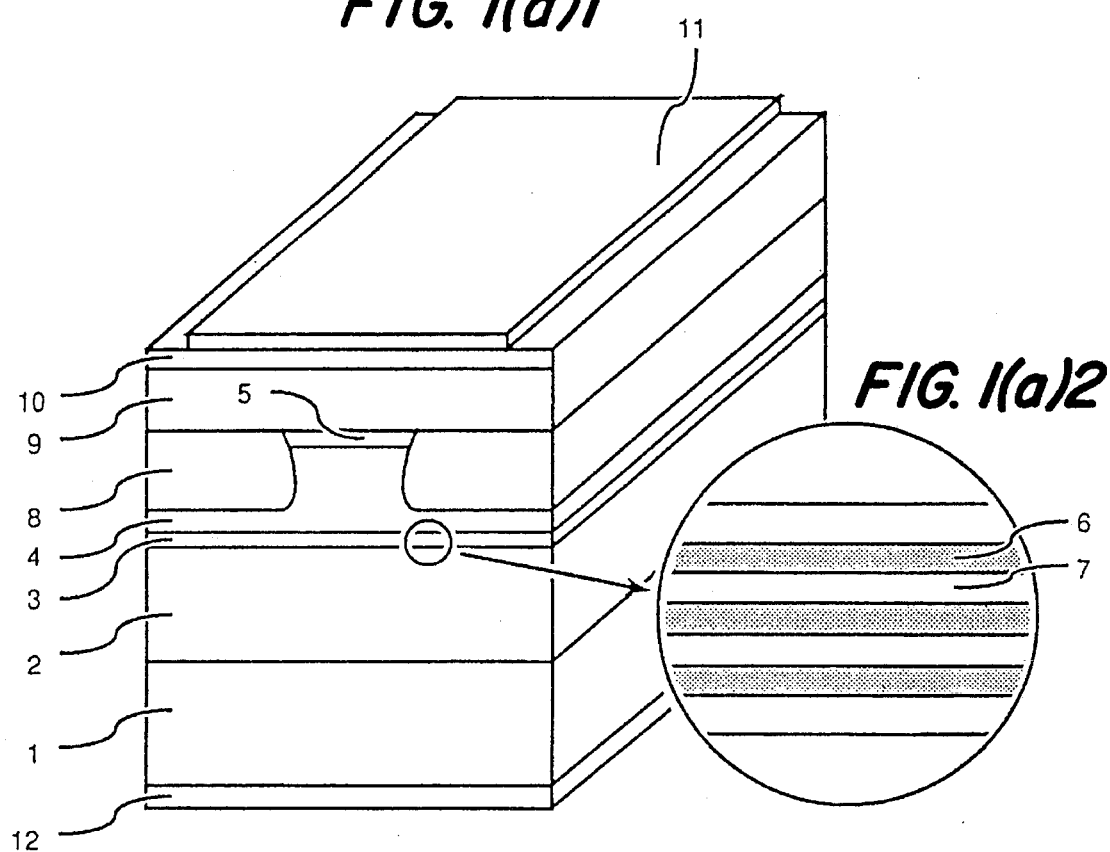
FIG. 1(a)1
FIG. 1(a)2
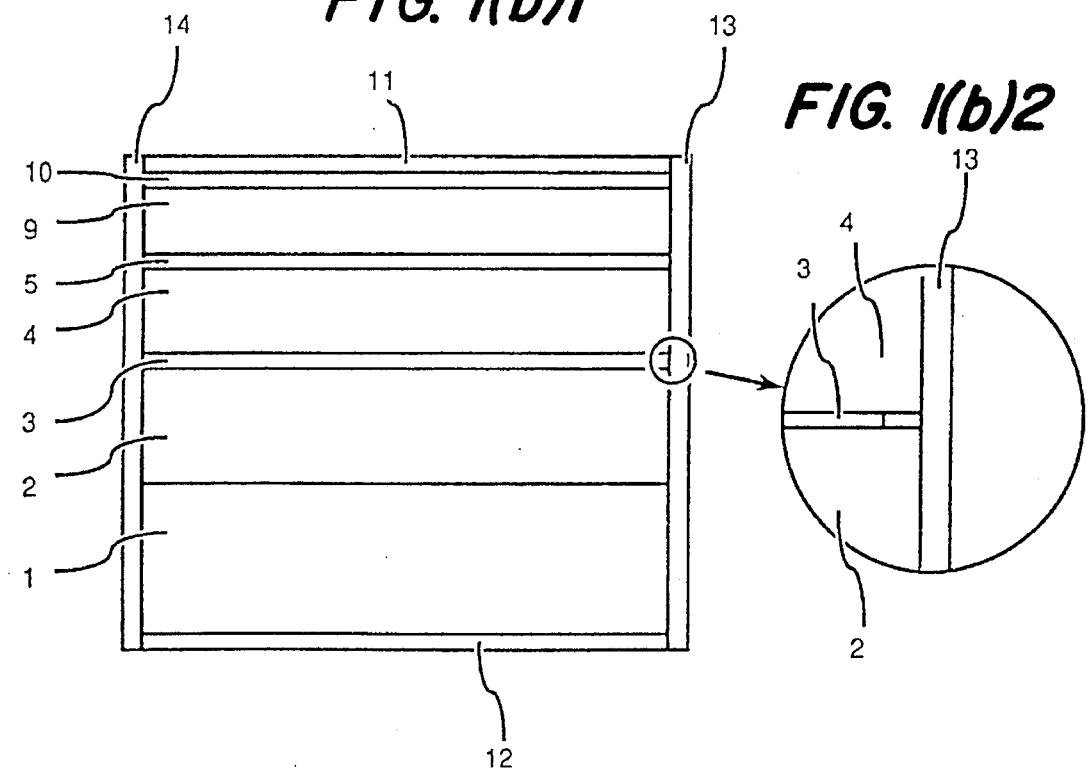
FIG. 1(b)1
FIG. 1(b)2

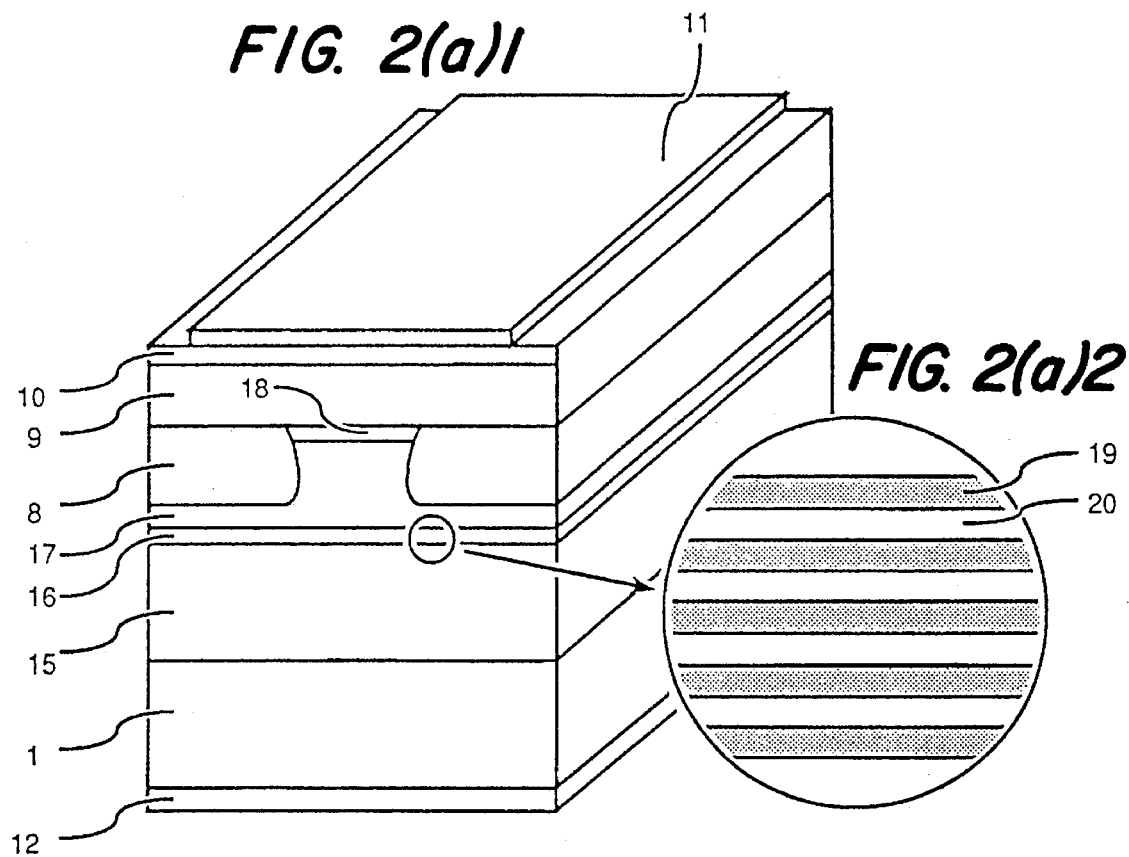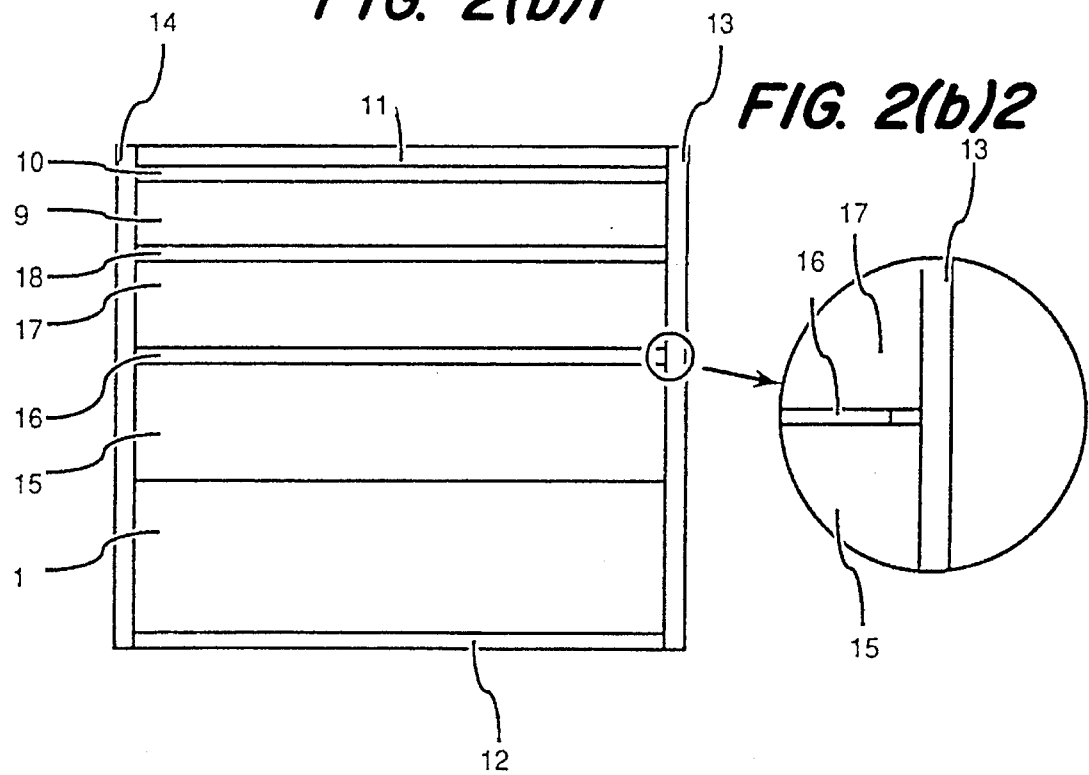

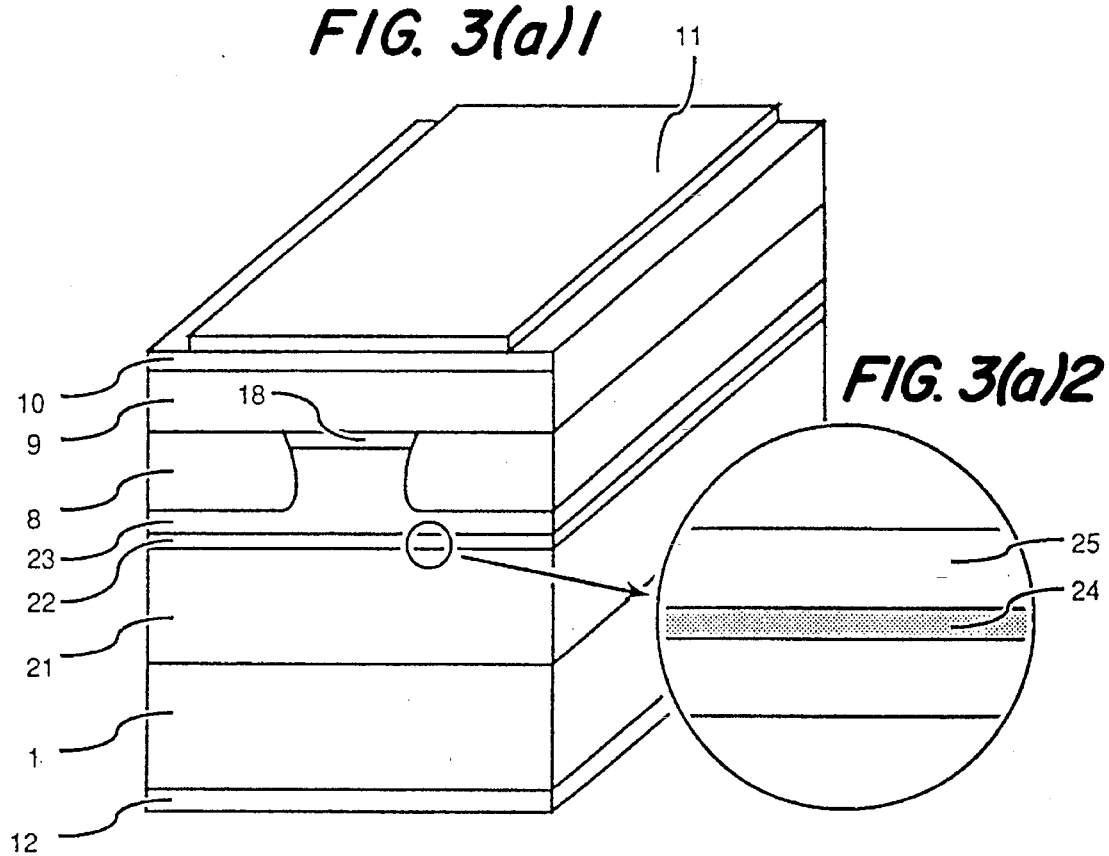
FIG. 3(a)1  FIG. 3(a)2
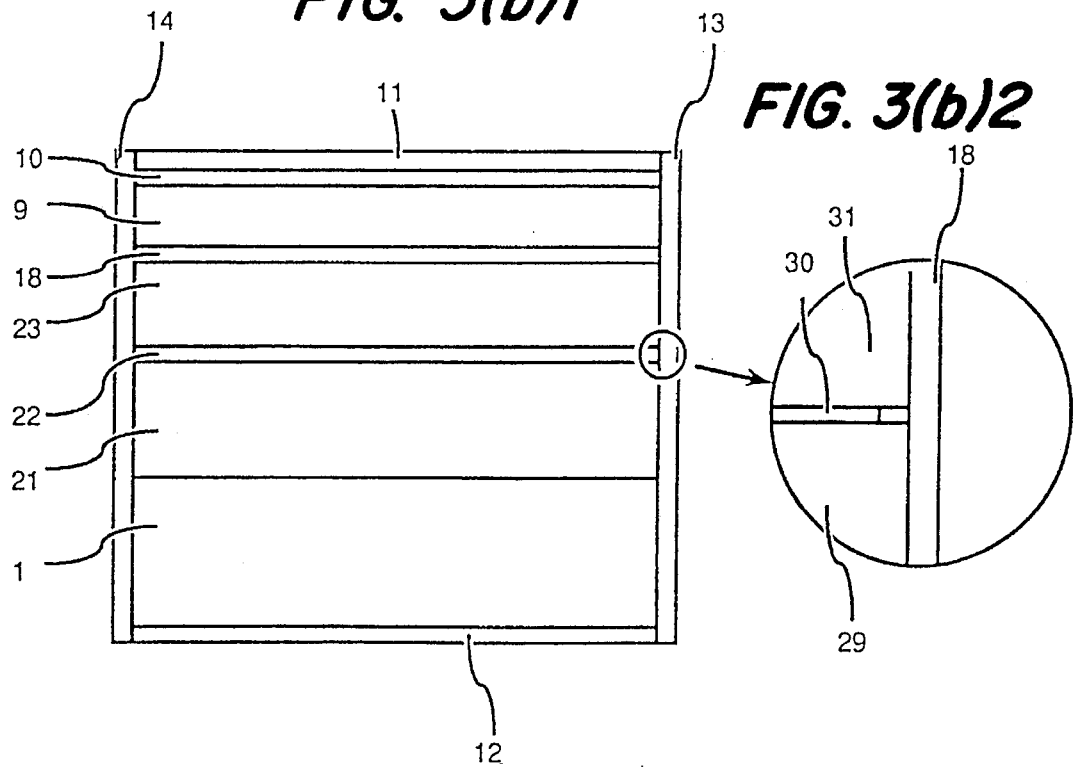
FIG. 3(b)1  FIG. 3(b)2

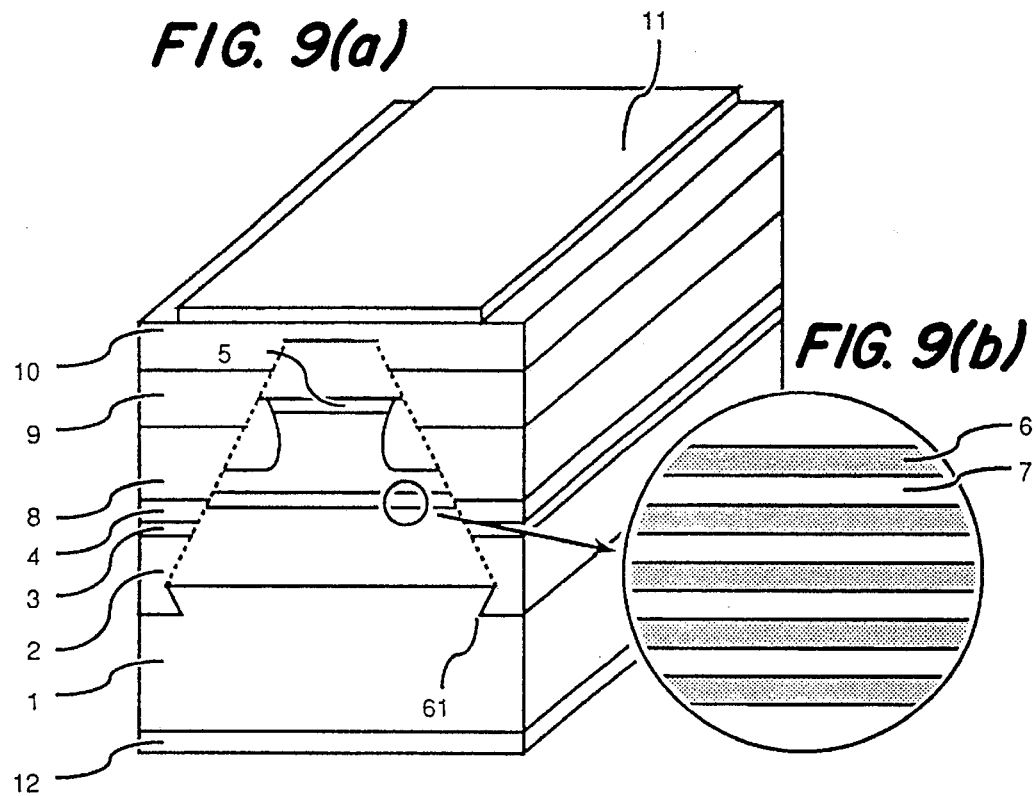
FIG. 9(a)
FIG. 9(b)
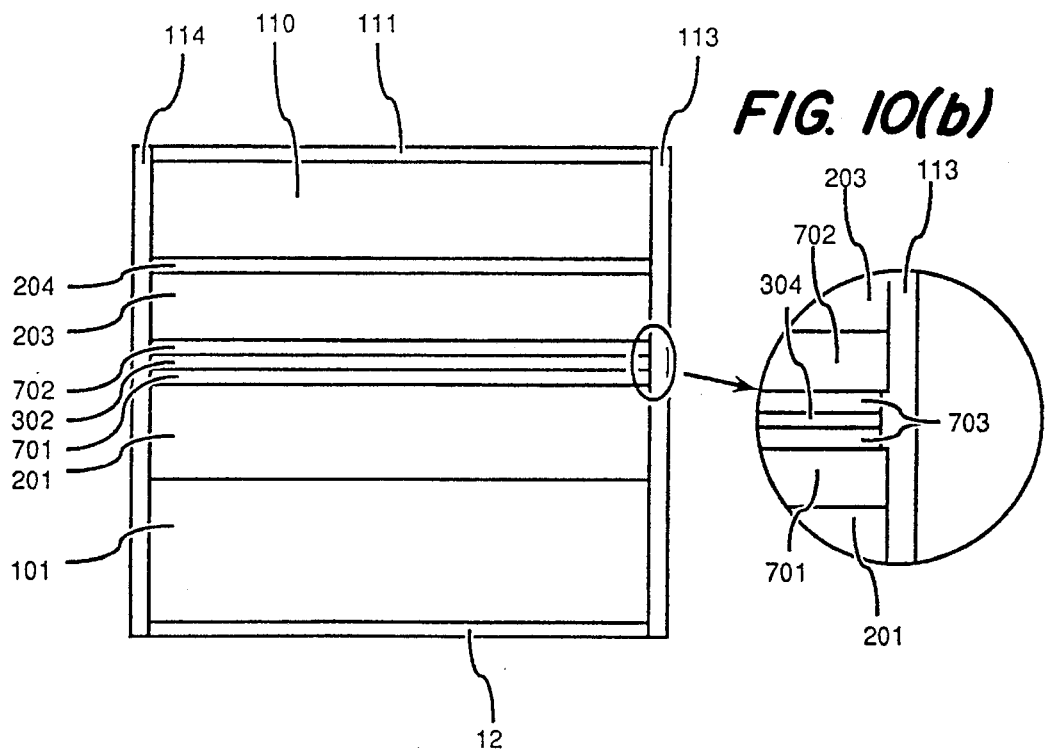
FIG. 10(a)
FIG. 10(b)

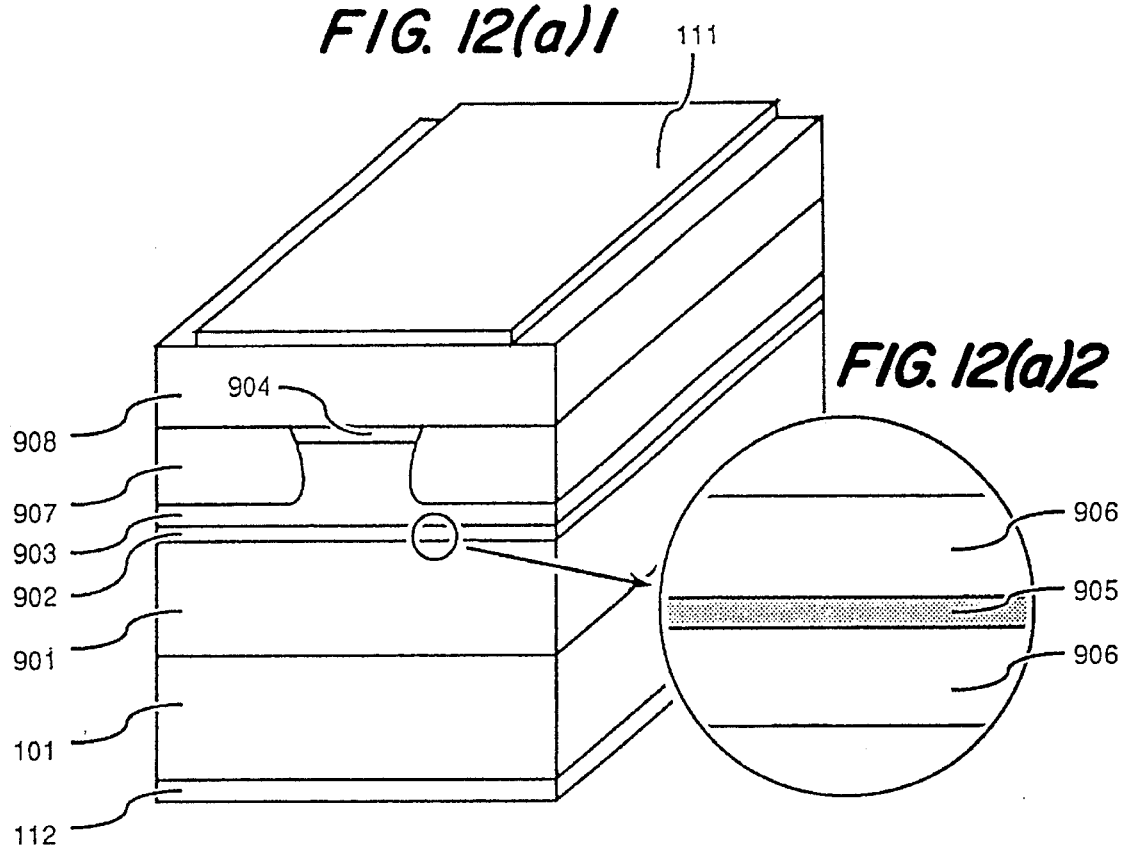
FIG. 12(a)1
FIG. 12(a)2
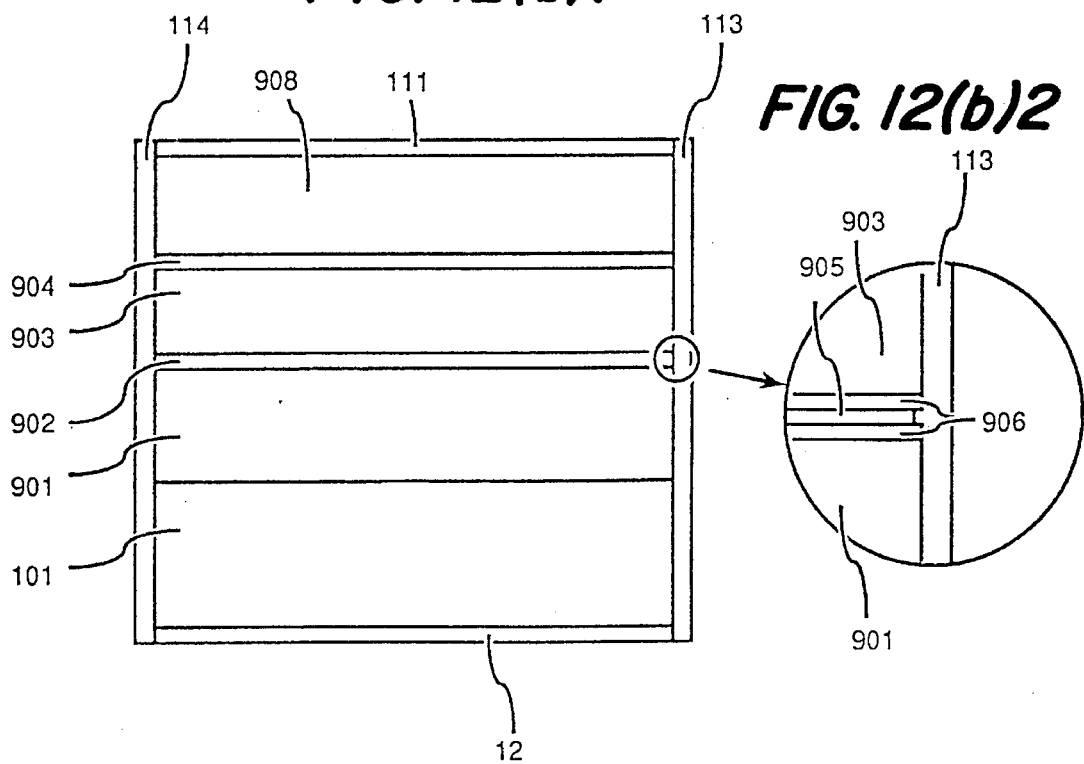
FIG. 12(b)1
FIG. 12(b)2

SEMICONDUCTOR LASER DEVICE AND A METHOD FOR THE MANUFACTURE THEREOF

BACKGROUND OF THE INVENTION

The present invention relates to a semiconductor laser device, and, more particularly, to a high-output semiconductor laser used as a light source for laser beam printers, optical disks and laser machining equipment, as well as the method of manufacture thereof.

A conventional high-output semiconductor laser, as shown in a perspective view of FIG. 5, consists of a substrate 26, a block layer 27, a cladding layer 28, an active layer 29, a cladding layer 30 and a cap layer 31, stacked together in that order. The light-emitting end surface is covered with an insulating film 13 such as $Al_2O_3$ to prevent chemical reaction to thereby protect the end surface against chemical damage. Such high-output semiconductor lasers are described in an article entitled "Water Vapor, Facet Erosion, and the Degradation of (Al,Ga)As DH Lasers Operated at CW Output Powers of Up to 3 mW/μ Stripewidth" by John A. F. Peek in the "IEEE Journal of Quantum Electronics" QE-1 7(5), pages 781–787, 1981.

The above-mentioned conventional high-output semiconductor laser has planar end surfaces comprised of at least the cladding layers 28, 30 and the active layer 29 on the light-emitting side. These three layers are stacked together and cleaved with the cleaved surface having the insulating film 13 formed directly over it. Hence, although it is possible to protect the semiconductor laser emitting end surface from chemical corrosion, first levels of recombination of a surface state that occur at the boundary between the semiconductor and the insulating film cannot be prevented completely, so that heat produced by recombination at the surface state may result in optical damage at the end surface. The higher the output of the semiconductor laser, the more likely the optical damage at the end surface will be.

SUMMARY OF THE INVENTION

An object of the present invention is to realize a semiconductor laser device that is capable of suppressing end surface damage due to heat and producing a high output.

Another object of this invention is to realize a simple method of manufacturing the semiconductor laser device that achieves the above objective.

To achieve the above objective, the semiconductor laser device of this invention is characterized in that at the light emitting end surface formed by at least an active layer and cladding layers, the end surface of the active layer is recessed inwardly toward the crystal side from the end surface of the cladding layers. The recessed state mentioned above includes not only the case where only the active layer is recessed from the cut end surface but also the case where the portions of the cladding layers adjacent to the active layer are progressively recessed as they approach the active layer.

The significance of the above-described recess can be appreciated from the following discussion. The heat produced by the recombination at the end surface of the semiconductor laser is dissipated mainly through the interior of the semiconductor, which is crystally continuous. When the end surfaces of the active layer and the cladding layers are planar, as shown in FIG. 6(a) illustrating the prior art, the heating surface lies on the surface of the crystal and increases toward the laser end, as shown by the isotherm 44. Thus, heat produced by the active layer 41 spreads in a semicircle centered around the light emitting end 42 of the active layer through the interior of the semiconductor. However, when the end surface of the active layer on the light emitting side is recessed into the crystal, as in the semiconductor laser device of this invention, the heat resistance near the active layer is small because the heat close to the active layer spreads in a circle with the active layer at the center 45, as shown in FIG. 6(b). This prevents a temperature rise at the end surface, thereby increasing the light output. As can be seen from comparing the prior art situation shown in FIG. 6(a) and the case of the present invention shown in FIG. 6(b), the temperature at the light-emitting end 45 in the present invention is much lower than the temperature of the light emitting end 42 of the prior art (noting the isotherm 46 in FIG. 6(b)). This decrease in temperature helps prevent optical damage at the end of the active layer. However, as will be discussed later with regard to FIG. 7, if the recess is too deep, this advantage is lost.

The depth of the recess needs to be set in a range that will achieve the above-discussed advantages of the invention without destroying the function of the device as a reflection face of an end of a semiconductor laser of the Fabry-Perot type, which the present invention generally deals with. The relationship between the etching depth and the maximum light output before optical damage occurs is shown in FIG. 7. As can be seen there, if the recess has a depth between 50 nm and 300 nm, the maximum light output will show a significant improvement relative to a device with a planar end surface. Specifically, if a device with a planar end surface has a maximum light output of 120 mW before optical damage occurs, if the recess is etched between 50 nm and 300 nm, the maximum light output can be increased to 150 mW of greater. In this example, the maximum value of 250 mW is achieved at a recess depth of 140 nm. However, if the etching is carried out to make the recess greater than 300 nm, the beneficial results become lost, and the maximum output becomes the same as a planar end surface device, or worse.

To manufacture the semiconductor laser device of this invention, such a recess is formed by cleaving the semiconductor laser wafer into bars and selectively etching the active layer with an etching solution. Further, to reduce the surface potential that is formed by chemical etching, the surface of the semiconductor crystal is washed with a cleaning liquid containing VI-group compounds including sulfur, selenium and tellurium to make the VI-group compounds adhere to the end surface of the active layer.

With regard to this, it should be noted that when the laser end surface is subjected to a chemical treatment such as etching, the surface potential in the etched area will have a tendency to become greater than that of the cleaved surface. This problem, however, can be solved by adsorbing VI-group compounds such as sulfur, selenium (Se) and tellurium (Te) onto the surface of the semiconductor crystal to stabilize the surface potential of the laser end surface.

BRIEF DESCRIPTION OF THE DRAWINGS

FIGS. 1(a) and 1(b) are perspective views showing the structure of the semiconductor laser in accordance with a first embodiment of the invention.

FIGS. 2(a) and 2(b) are perspective views showing the structure of the semiconductor laser in accordance with a second embodiment of the invention.

FIGS. 3(a) and 3(b) are perspective views showing the structure of the semiconductor laser in accordance with a third embodiment of the invention.

FIGS. 6(a) and 6(b) are conceptual diagrams showing a temperature distributions in the end surface area, wherein FIG. 6(a) shows the distribution for the prior art and FIG. 6(b) shows the distribution for the present invention.

FIG. 8 shows a semiconductor laser structure of a fifth embodiment of this invention.

FIG. 9 shows the semiconductor laser structure of a sixth embodiment of this invention.

FIG. 10 shows the semiconductor laser structure of a seventh embodiment of this invention.

FIGS. 12(a) and 12(b) show the semiconductor laser structure of a tenth embodiment of this invention.

DETAILED DESCRIPTION

Figure 4A:
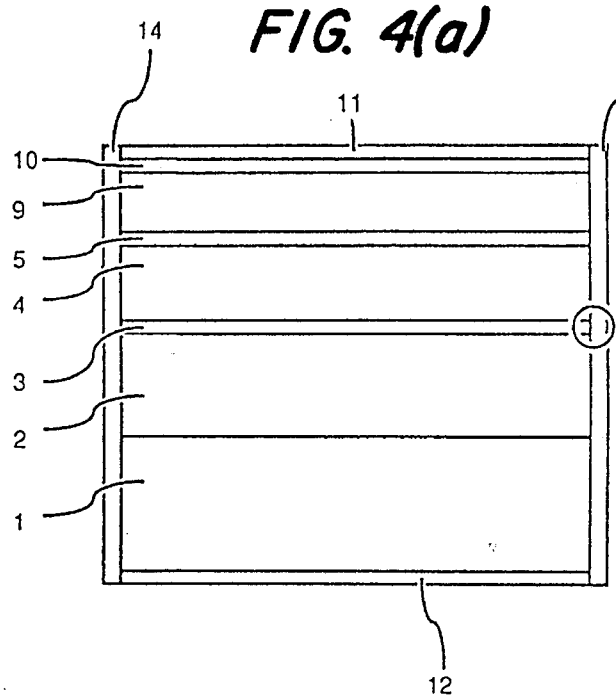
FIG. 4 is a schematic view showing the cross-sectional structure of the clad layer and the active layer or the semiconductor laser device in accordance with a fourth embodiment of this invention.

Embodiments of this invention will be described by referring to the accompanying drawings.

FIGS. 1(a) and 1(b) show the structure of the first embodiment of the semiconductor laser device according to this invention. FIG. 1(a) is a perspective view of a wafer of the semiconductor laser during the process of manufacture, and FIG. 1(b) a side cross section of the semiconductor laser device. In this embodiment, on the n-type GaAs substrate 1 were epitaxially grown an n-type $Al_{0.5}Ga_{0.5}As$ cladding layer 2, a multi-quantum well active layer 3, a p-type $Al_{0.5}Ga_{0.5}As$ cladding layer 4, and a p-type GaAs contact layer 5 in that order. The multi-quantum well active layer 3, as shown in the partially magnified view, consists of three GaAs well layers 6 and four $Al_{0.3}Ga_{0.7}As$ barrier layers 7, alternately stacked.

In order to manufacture the device shown in FIG. 1(a), on the upper surface of the contact layer 5 in this structure was deposited a striped $SiO_2$ film (not shown for sake of drawing simplicity) by using a thermal CVD method and photolithography. With this $SiO_2$ film as a mask, the p-type GaAs contact layer 5 and a part of the p-type $Al_{0.5}Ga_{0.5}As$ cladding layer 4 were etched. Then, an n-type GaAs block layer 8 was selectively grown in the region where there was no $SiO_2$ film by means of a metal-organic chemical vapor deposition. To reduce the series resistance of the device, a p-type $Al_{0.5}Ga_{0.5}As$ buried layer 9 and a p-type GaAs cap layer 10 were formed after removing the $SiO_2$ layer. Next, an electrode 11 made mainly of Au was deposited on the surface of the wafer. The GaAs substrate 1 was etched down to a thickness of about 100 μm by mechanical polishing and chemical etching, after which an electrode 12 made mainly of Au was also formed on the underside of the GaAs substrate 1. This semiconductor wafer was then cleaved into bars at approximately 600 μm intervals. FIG. 1(a) shows the perspective view of the semiconductor laser device at this stage of fabrication process.

Next, the multi-quantum well active layer 3 exposed at the cleaved surface of the bar was etched inwardly from the cleaved surface by ammonium etching solution. For example, a suitable etching liquid is $HN_4OH:H_2O_2:H_2O=$ 1:100:1000. The laser is preferably soaked in this solution for sufficient time to achieve the desired etching (for example, typically about 10 seconds). With a solution of this type, the ratio of the etching speed of the active layer and the cladding layer is about 20:1. At this time, because the $Al_{0.5}Ga_{0.5}As$ cladding layers 2 and 4 were not substantially etched by the ammonium etching solution, the wall active layer 3 was recessed a distance between 50 nm and 300 nm at the cleaved end surface, as shown in the side view of FIG. 1(b), depending on the degree of etching performed. The front end surface (light emitting surface) of the semiconductor laser device was formed with an $Al_2O_3$ reflection prevention coating 13 (reflection factor 5%) and the rear end surface with a high-reflection coating 14 made of an amorphous $Si/Al_2O_3$ (reflection factor 90%). Afterwards, if desired, the previously mentioned VI Group treatment can be carried out so that VI-group compounds can be absorbed to stabilize the surface potential at the laser end surface.

The etching solution can be selected to use an organic acid, for example, tartaric acid, citric acid or acetic acid. The composition of these organic acids is selected to primarily etch only the GaAs well layer. As a result, a desired amount of GaAs well layer is removed without removing substantial amounts of other layers. The overall desired shape is obtained later by etching the $Al_{0.3}Ga_{0.7}As$ barrier layer by a $(NH_3)Sx$ solution. In this case, a surface stabilization effect can be gained by $(NH_3)Sx$ too. As a result, the output and reliability of the semiconductor laser can be further increased.

As is shown in FIG. 1(b), a void generally originates between the recessed end of the active layer 3 and the coating 13. But this void does not originate on the material of coating 13 too.

A semiconductor laser of this embodiment can operate stably for 10,000 hours or more while providing an optical output 100 mW in an environment of 70 degrees centigrade.

FIGS. 2(a) and 2(b) show the structure of the second embodiment of the semiconductor laser device according to this invention. FIG. 2(a) is a perspective view of a wafer of the semiconductor laser during the process of manufacture, and FIG. 2(b) a side cross section of the semiconductor laser device. Parts identical with those of FIG. 1 are assigned like reference numerals.

In this embodiment, on the n-type GaAs substrate 1 were epitaxially grown an n-type $(Al_{0.7}Ga_{0.3})_{0.5}In_{0.5}P$ cladding layer 15, a multi-quantum well active layer 16, a p-type $(Al_{0.7}Ga_{0.3})_{0.5}In_{0.5}P$ cladding layer 17, and a p-type $Ga_{0.5}In_{0.5}P$ contact layer 18 in that order. The multi-quantum well active layer 16, as shown in the circular enlarged view, consists of five $Ga_{0.5}In_{0.5}P$ well layers 19 and four $(Al_{0.3}Ga_{0.3})_{0.5}In_{0.5}P$ barrier layers alternately arranged.

Next, on the upper surface of the contact layer 18 a striped $SiO_2$ film was deposited by using a thermal CVD method and photolithography. With this $SiO_2$ film as a mask, the p-type $Ga_{0.5}In_{0.5}P$ contact layer 18 and a part of the p-type $(Al_{0.7}Ga_{0.3})_{0.5}In_{0.5}P$ cladding layer 17 were etched. Then, an n-type GaAs block layer 8 was selectively grown in the region where there was no $SiO_2$ film by means of metal-organic chemical vapor deposition.

To reduce the series resistance of the device, a p-type $Al_{0.5}Ga_{0.5}As$ embedded layer 9 and a p-type GaAs cap layer 10 were formed after removing the $SiO_2$ layer. Next, an electrode 11 made mainly of Au was deposited on the surface of the cap layer 10. The GaAs substrate 1 was etched down to a thickness of about 100 μm by mechanical polishing and chemical etching, after which an electrode 12 made mainly of Au was also formed on the underside of the GaAs substrate 1.

The semiconductor wafer thus obtained was then cleaved into bars at approximately 600 μm intervals. FIG. 2(a) shows the cross section of the semiconductor laser device at this stage of the fabrication process. The multiquantum well active layer 16 exposed at the cleaved surface of the bar was etched by a hydrochloric acid etching solution. At this time, since the (AlGa)InP cladding layers 15 and 17 were not substantially etched by the hydrochloric acid solution, the active layer 16 was recessed by an amount between 50 nm to 300 nm at the cleaved end surface, as shown in the side view of FIG. 2(b) depending upon the amount of etching performed. The front end surface of the semiconductor laser device was coated with an $Al_2O_3$ reflection prevention coating 13 (reflection factor 5%) and the rear end surface with a high-reflection coating 14 made of an amorphous $Si/Al_2O_3$ (reflection factor 90%).

A semiconductor laser of this embodiment can stably operate 10,000 hours or more with an optical output of 50 mW in an environment of 70 degrees centigrade.

FIGS. 3(a) and 3(b) show the structure of the third embodiment of the semiconductor laser device according to this invention. FIG. 3(a) is a perspective view of the device during the fabrication process; and FIG. 3(b) is a side cross section of the semiconductor laser device. Parts identical with those of the preceding figures are assigned like reference numerals.

In this embodiment, on the n-type GaAs substrate 1 were epitaxially grown an n-type $Ga_{0.5}In_{0.5}P$ cladding layer 21, a single quantum well active layer 22, a p-type $Ga_{0.5}In_{0.5}P$ cladding layer 23, and a p-type $Ga_{0.5}In_{0.5}P$ contact layer 18 in that order. The single quantum well active layer 22, as shown in the circular enlarged view, consists of a single $Ga_{0.8}In_{0.2}As$ well layer 24 sandwiched by two GaAs guide layers 25.

Next, on the upper surface of the contact layer 18 a striped $SiO_2$ film was deposited by using a thermal CVD method and photolithography. With this $SiO_2$ film as a mask, the p-type $Ga_{0.5}In_{0.5}P$ contact layer 18 and a part of the p-type $Ga_{0.5}In_{0.5}P$ cladding layer 23 were etched. Then, an n-type GaAs block layer 8 was selectively grown in the region where there was no $SiO_2$ film by means of metal-organic chemical vapor deposition. To reduce the series resistance of the device, a p-type $Al_{0.5}Ga_{0.5}As$ embedded layer 9 and a p-type GaAs cap layer 10 were formed after removing the $SiO_2$ layer.

Next, an electrode 11 made mainly of Au was deposited on the surface of the cap layer 10. The GaAs substrate 1 was etched down to a thickness of about 100 μm by mechanical polishing and chemical etching, after which an electrode 12 made mainly of Au was also formed on the underside of the GaAs substrate 1. The semiconductor wafer thus obtained was then cleaved into bars at approximately 600 μm intervals.

FIG. 3(a) shows the cross section of the semiconductor laser device at this stage of the fabrication process. The single quantum well active layer 22 exposed at the cleaved surface of the bar was etched by an ammonium etching solution. At this time, since the GaInP cladding layers 21 and 23 were mostly not etched by the ammonium etching solution, the active layer 30 was recessed between 50 nm and 300 nm at the cleaved end surface, as shown in the partially enlarged view of FIG. 3(b), depending upon the degree of etching performed. The front end surface of the semiconductor laser device was then coated with an $Al_2O_3$ reflection prevention coating 13 (reflection factor 5%) and the rear end surface with a high-reflection coating 14 made of an amorphous $Si/Al_2O_3$ (reflection factor 90%).

A semiconductor laser of this embodiment can stably operate 10,000 hours or more with an optical output of 150 mW in an environment of 70 degrees centigrade.

Figure 4B:
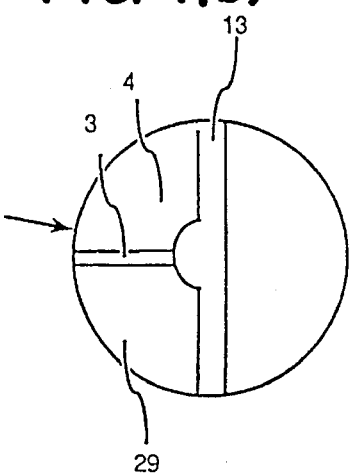
Figure 5:
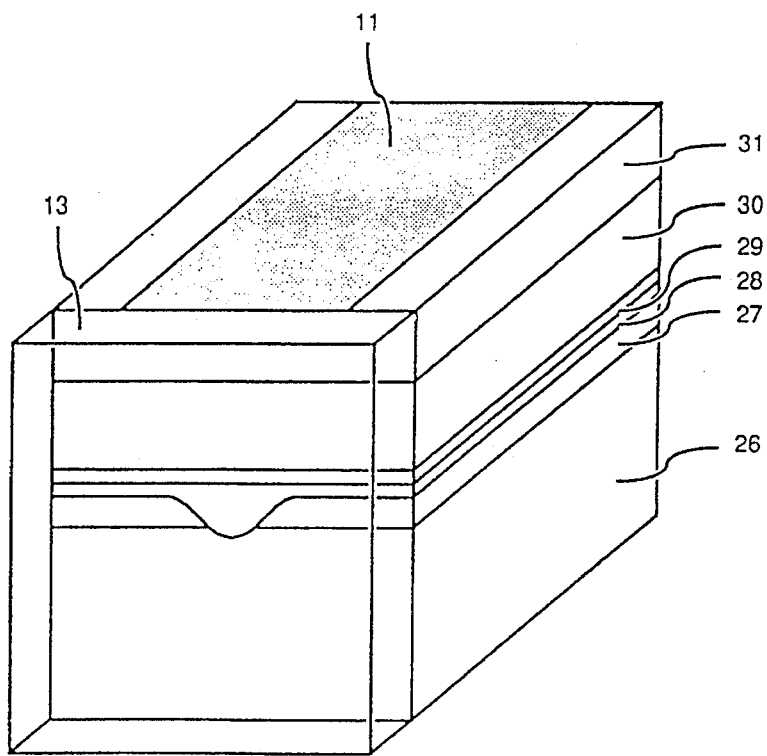
FIG. 5 is a perspective view showing the structure of a conventional semiconductor laser.
Figure 6A:
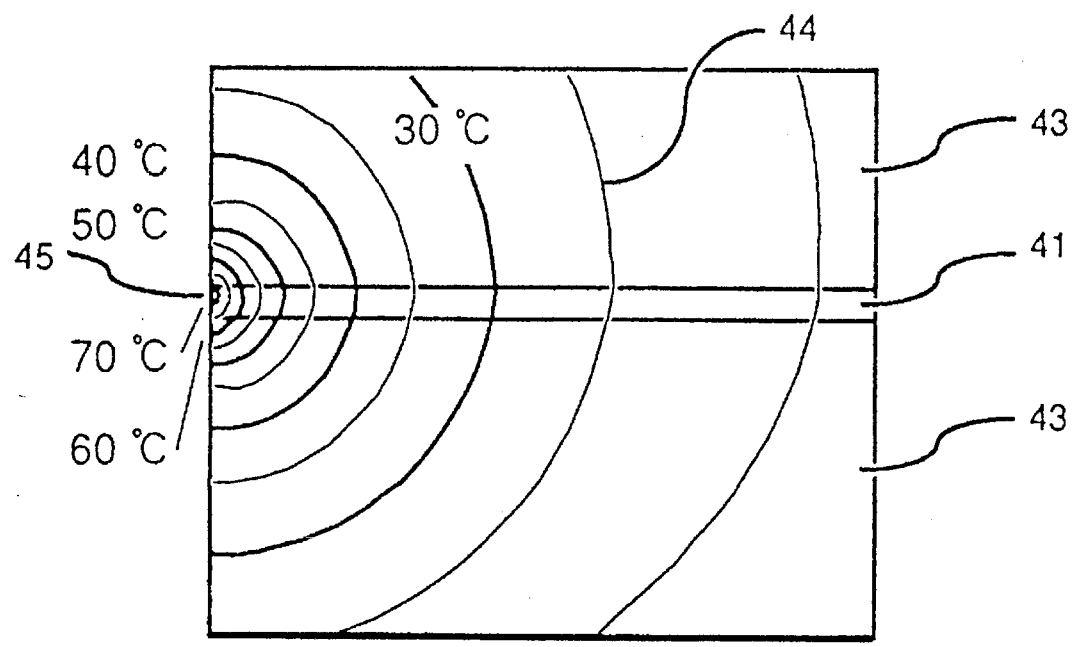
Figure 6B:
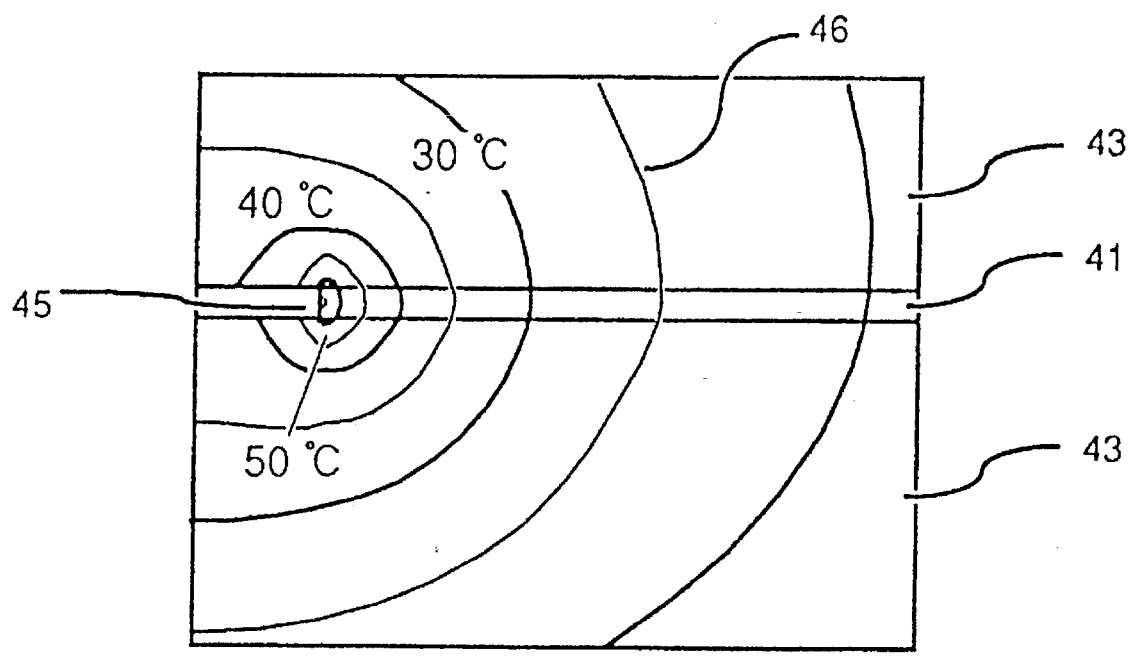
Figure 7:
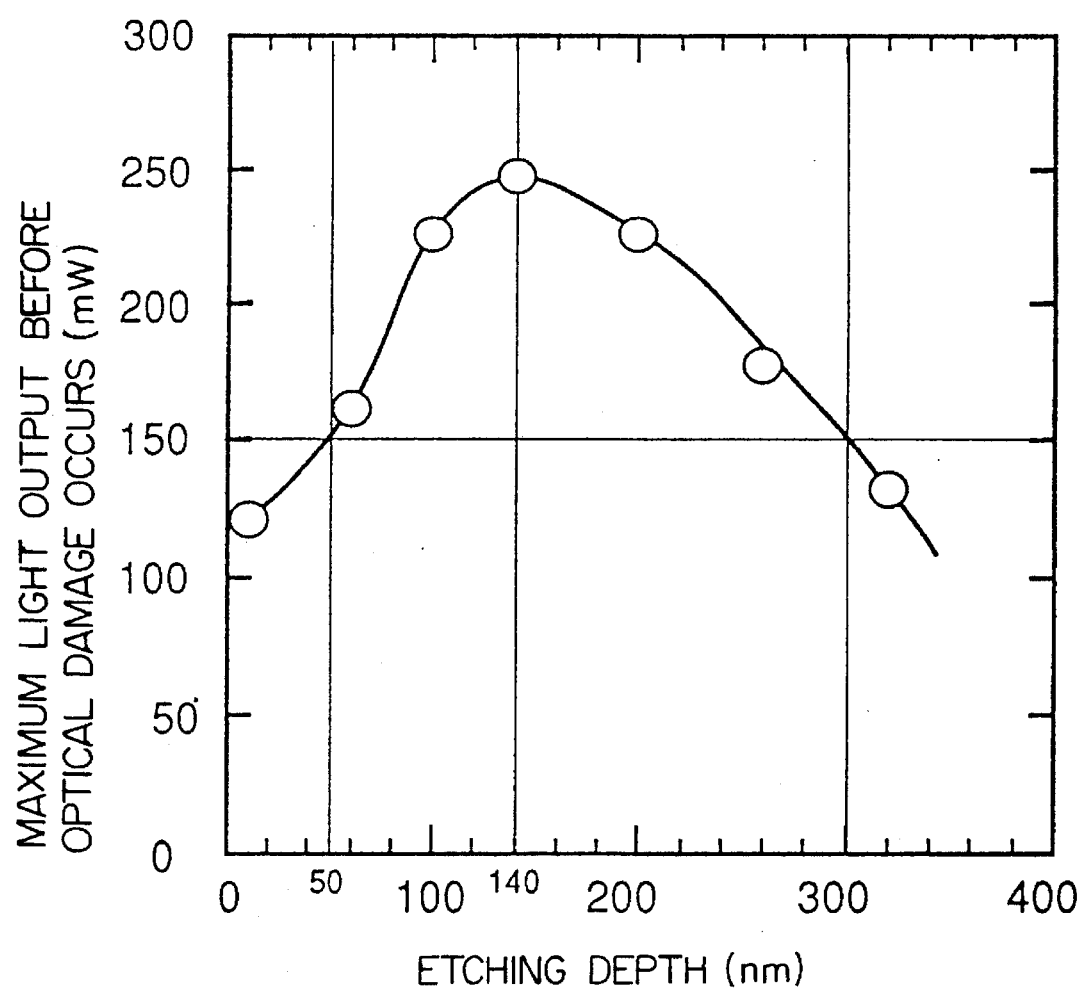
FIG. 7 shows a relationship between the etching depth and the maximum light output possible before optical damage occurs.
Figure 7:
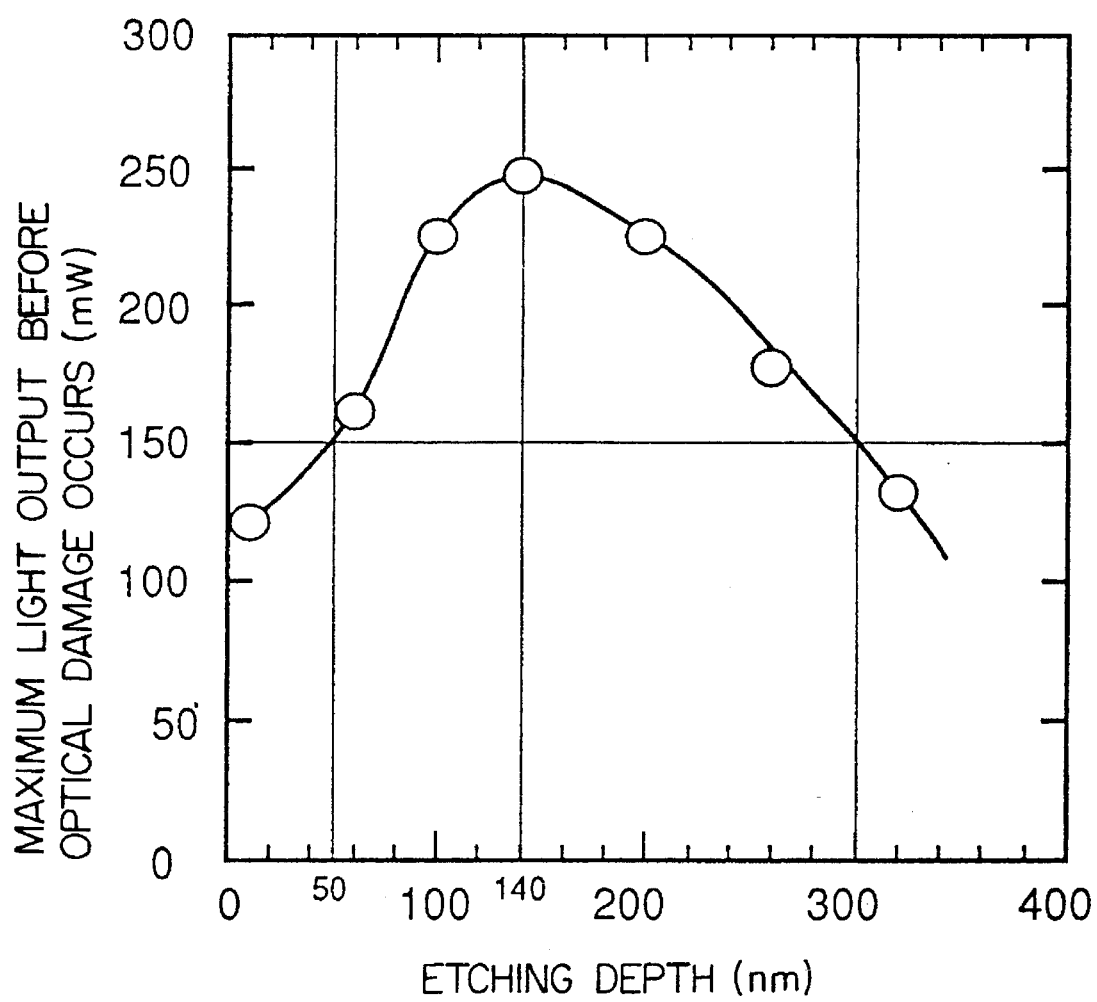

FIG. 4 shows a cross-sectional structure of the fourth embodiment of the semiconductor laser device according to this invention. In the first to third embodiment, the active layer is etched by a highly selective etching solution. This embodiment uses an ammonium etching solution whose etching speed for the active layer is several times faster than the etching speed for the clad layers. In this case, because the selectivity is small, etching is done not only to the active layer but to the clad layers as well, forming the recess as shown in the figure. Such a recess can also be formed by a reverse sputtering, which is performed prior to the formation of the reflection film at the end surface. Even if the contour formed by the selective etching is not perfect, the light output has improved by about 30 to 40 percent. Although the end surface protection effect with this structure is small compared with the case where only the active layer is etched away, this structure has the advantage that the range of etching time for producing good characteristics is wide and that the processing is relatively easy.

FIG. 8 shows a cross-sectional structure of the fifth embodiment of the semiconductor laser device according to this invention. The manufacturing process of the semiconductor laser is similar to the first embodiment, and after the device is formed, an $Al_2O_3$ film 13 is formed on the end surface by sputtering. At this time, if the sputtering energy and the flow of argon gas are set to appropriate values, the $Al_2O_3$ film 13 does not adhere to the interior of the groove at the active layer 3, leaving a gap 51. Such an end protection film is effective for increasing the output power of the semiconductor laser by its action of chemically protecting the laser end surface and the action of controlling the reflection factor of the end surface. However, if it contacts the active layer it has a drawback of lowering the reliability because of stress between the reflection film and the semiconductor. Therefore, in this embodiment, because the $Al_2O_3$ film, though it shields the semiconductor surface from open air, is not in physical contact with the active layer, the above problem of the end surface protection film can be eliminated.

In this embodiment, the use of organic acid in etching the active layer forms the bottom surface of the active layer into a (111) plane 52, which is chemically stable, producing a greater end surface protection effect. It is also effective to add $(NH_4)_2S$, $(NH_4)_2Se$ and $(NH_4)_2Te$ to the organic acid or to perform a surface treatment with $(NH_3)Sx$ after selective etching to protect the bottom surface of the active layer with the VI-group elements 53.

FIG. 9 shows the structure of the sixth embodiment of the semiconductor laser device according to this invention. This embodiment improves the device structure over the fifth embodiment to realize a more perfect shielding from open air of the end surface by the $Al_2O_3$ film 13. In the fifth embodiment, the etching of the active layer results in a grooved structure. When a protective layer 13 covers over the groove, although the ingress of gas from the film surface can be prevented, it is not possible to prevent gas from entering from holes at the side surfaces formed when the semiconductor laser is fabricated in a chip. That is, gas cannot perfectly be shut out. To solve this problem, the sixth embodiment forms a step 61 in an area near the end surface, located about 50 μm from the laser stripe of the substrate, as shown in FIG. 9, before the crystal is grown on the substrate. On this substrate a crystal is grown in the same way as in the first embodiment. Because the active layer is discontinuous at the edge of the recessed portion of the substrate, as shown in FIG. 9, the groove formed during the active layer etching is also interrupted at this location, so that there is no possibility of external air entering into the striped portion of the active layer during the chip separation process, thus permitting a complete gas shielding. Incidentally, it is noted that the layer 13 has not been shown in FIG. 9, but would be placed over the end surface in the same manner shown, for example, in FIG. 8.

FIG. 10 shows the structure of the seventh embodiment of the semiconductor laser device according to this invention. This structure leaves an optical guide layer also in a region where the active layer is removed in order to overcome the drawback that the light does not pass through the active layer-removed portion and that too deep an etch will deteriorate the characteristic. This structure has grown successively on an n-GaAs substrate 101 an n-$(Al_{0.7}Ga_{0.3})_{0.5}In_{0.5}P$ clad layer 201, an n-$Ga_{0.9}In_{0.1}As_{0.8}P_{0.2}$ lightguide layer 701, a multi-quantum well active layer 302, a p-$Ga_{0.9}In_{0.1}As_{0.8}P_{0.2}$ lightguide layer 702, a p-$(Al_{0.7}Ga_{0.3})_{0.5}In_{0.5}P$ clad layer 203, and a p-$Ga_{0.5}In_{0.5}P$ contact layer 204. The multi-quantum well active layer 302 was formed of a $Ga_{0.8}In_{0.2}As$ well layer 304 and a GaAs barrier layer 703. Then, this structure was formed with a striped $SiO_2$ film using thermal chemical vapor deposition and photolithography. With this $SiO_2$ film as a mask, a p-$Ga_{0.5}In_{0.5}P$ contact layer 204 and a p-$(Al_{0.7}Ga_{0.3})_{0.5}In_{0.5}P$ clad layer 203 were partly etched, after which an n-$Ga_{0.5}In_{0.5}P$ block layer (not shown) was selectively grown in areas where the $SiO_2$ film did not exist by metal organic vapor phase epitaxy. To reduce the series resistance of the device, a p-GaAs cap layer 110 was formed after removing the $SiO_2$ film. Next, an electrode 111 made mainly of Au was deposited over the surface of the wafer, and the GaAs substrate was subjected to mechanical polishing and chemical etching down to a thickness of about 100 μm. On the GaAs substrate side another electrode 12 made mainly of Au was formed.

Next, the semiconductor wafer was cut in bars at about 600 μm intervals. Next, the multi-quantum well active layer 302 exposed at the cut surface of the crystal bar was etched to a thickness of about 300 nm with a sulfuric acid etching solution. At this time, because the crystal is only slightly etched by the sulfuric acid etching solution containing phosphorus, the active layer is recessed leaving the lightguide layer. The etching solution is 1:2:50 $H_2SO_4$, $H_2O_2$ and $H_2O$, and the etching duration is about 10 seconds.

In the structure of the first to sixth embodiments, the etching of active layer this deep resulted in somewhat deteriorated device characteristics. In the seventh embodiment, however, the remaining lightguide layer provides a light-guide function and allows a deep etch, producing a greater advantage. The device has its front end surface coated with a reflection prevention coating 113 (reflection factor 5%) of $Al_2O_3$ and the rear end surface coated with a high reflection coating 114 (reflection factor 90%) of a-Si/$Al_2O_3$. The semiconductor laser of this embodiment remaining in a stable operational condition for more than 10,000 hours at 70° C. and light output of 150 mW.

Figure 11:
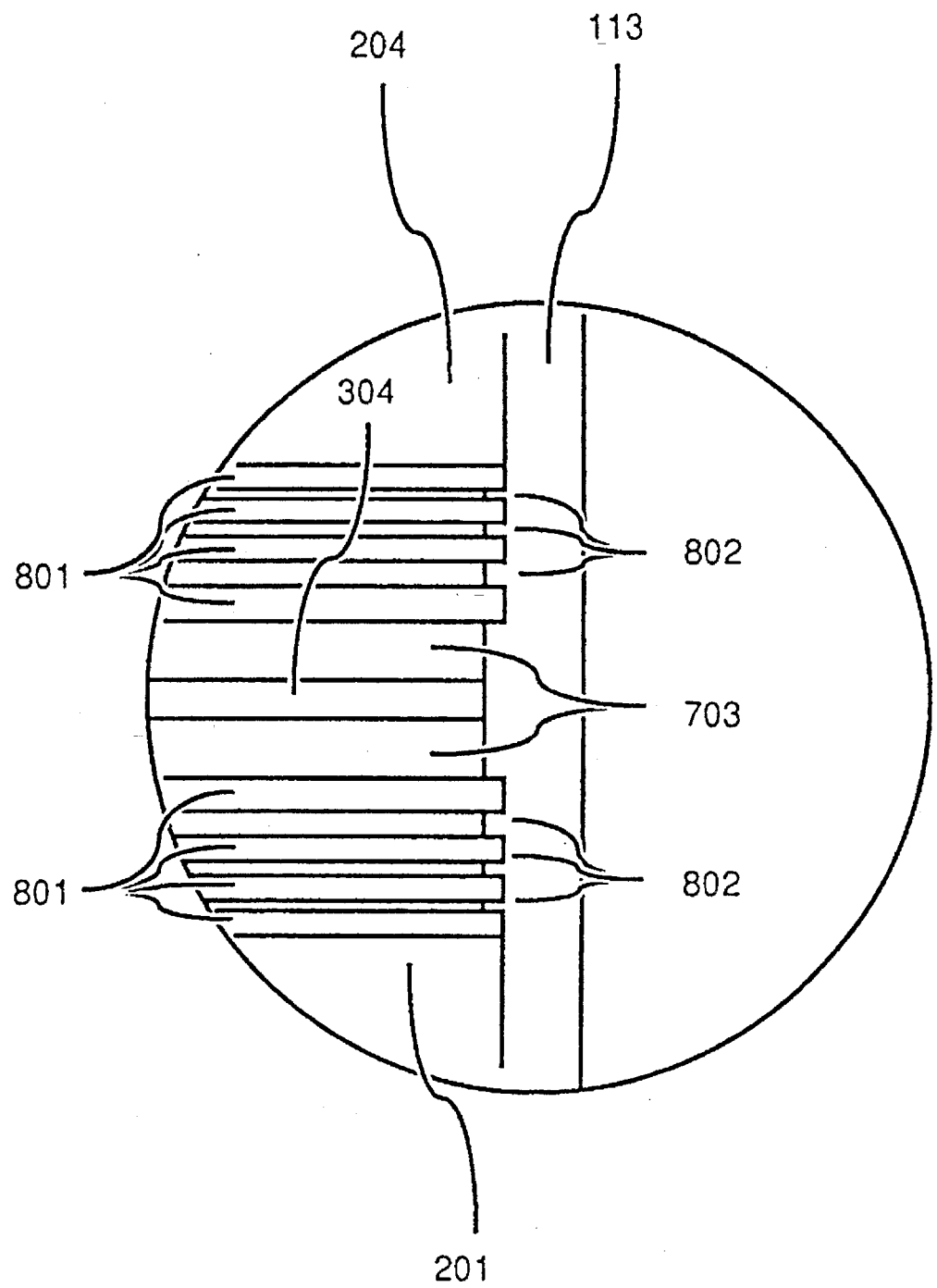
FIG. 11 shows the semiconductor laser structure of an eighth embodiment of this invention.

The eighth embodiment is shown in FIG. 11, in which the lightguide layer is formed as a multi-layer structure of an InGaAsP layer 801 and a GaAs layer 802, rather than a single InGaAsP layer as in the seventh embodiment. In this structure, the InGaAsP layer is set to 10 nm in thickness and the GaAs layers are made progressively thinner, from 10 nm to 6 nm to 3 nm, as they become more distant from the active layer. By etching the GaAs layer in the lightguide layer of this structure, it is possible to provide the end surface of the semiconductor laser with a lens effect and thereby narrow the beam emitted from the semiconductor laser.

In a manner similar to that of the seventh embodiment, the ninth embodiment of this invention forms the end surface of the semiconductor crystal by using a reactive ion etching instead of cleavage. In this structure, since the laser light is guided not only through the active layer, it is possible to limit the diffusion of light in the clad layer while keeping the light-trapping in the active layer to an appropriate level. Therefore, it is possible to provide a semiconductor laser which has good initial characteristics and which is free from such problems as deviations of the inclined end surface from the vertical line and a deteriorated reflection function due to roughness of the end surface, often encountered when the end surface of the semiconductor laser is formed by reactive ion etching or chemical etching. Even with such a structure, however, it has been difficult to obtain good reliability because of the roughened surface of the end surface portion. In this invention, this structure is further subjected to an active layer etching with a sulfuric acid etching solution to improve the reliability of the device to more than 10,000 hours of operation at 100° C. and output of 100 mW.

FIGS. 12(a) and 12(b) show the structure of the tenth embodiment of the semiconductor laser device according to this invention. This embodiment represents a case where the invention is applied to a semiconductor laser formed of II-VI compound semiconductor. This structure has grown successively on an n-GaAs substrate 101 an n-$Mg_{0.1}Zn_{0.9}S_{0.14}Se_{0.86}$ clad layer 901, a single quantum well active layer 902, a p-$Mg_{0.1}Zn_{0.9}S_{0.14}Se_{0.86}$ clad layer 903, and a p-$ZnSe_{0.5}Te_{0.5}$ contact layer 904. The single quantum well 902 consists of a $Cd_{0.3}Zn_{0.7}Se$ well layer 905 sandwiched between $ZnS_{0.07}Se_{0.93}$ guide layers 906. Next, this structure is formed with a striped $SiO_2$ film by thermal chemical vapor deposition and photolithography. With this $SiO_2$ film as a mask, the p-$ZnSe_{0.5}Te_{0.5}$ contact layer 904 and the p-$Mg_{0.1}Zn_{0.9}S_{0.14}Se_{0.86}$ clad layer 903 were partially etched. After this, an n-$Mg_{0.3}Zn_{0.7}S_{0.35}Se_{0.65}$ block layer 907 was selectively grown where there was no $SiO_2$ film by the metal organic vapor phase epitaxy. To reduce the series resistance of the device, a P-$ZnSe_{0.5}Te_{0.5}$ embedded layer 908 was formed after removing the $SiO_2$ film. Next, an electrode 111 made mainly of Au was deposited over the surface of the wafer and the GaAs substrate was subjected to mechanical polishing and chemical etching down to a thickness of about 100 μm. On the GaAs substrate side another electrode 112 made mainly of Au is formed.

Next, the semiconductor wafer was cut in bars at about 600 μm intervals. FIG. 12(a) shows the cross section of the semiconductor laser at this fabrication stage. The single quantum well active layer 902 exposed at the cut surface of the crystal bar was etched to a thickness of about 150 nm with a chromic acid etching solution. At this time, because the MgZnSSe clad layer is not etched by the hydrochloric acid etching solution, the active layer is recessed as shown in FIG. 12(b). The device has its front end surface coated with a reflection prevention coating 113 (reflection factor 5%) of $Al_2O_3$ and the rear end surface coated with a high reflection coating 114 (reflection factor 90%) of a-Si/$Al_2O_3$. As a result, the semiconductor laser of this embodiment remained in a stable operational condition for more than 10,000 hours at 70° C. and light output of 20 mW.

This invention is not limited to the above embodiments. For example, although the above embodiment has a single light emitting end surface, the light may be emitted from both sides. It should be noted that the active layer can be recessed at both sides to achieve the advantages discussed above.

With this invention, it is possible to increase the light output of the semiconductor laser by 30 to 100 percent only by adding a chemical etching step to the conventional fabrication process of the high-output semiconductor laser.

We claim:

1. A semiconductor laser device comprising:

two cladding layers formed of a semiconductor crystal; and an active layer formed of a semiconductor crystal and sandwiched between the two cladding layers;

wherein a laser light is emitted from an end surface of the active layer when electricity is applied to the semiconductor laser device; and wherein at the laser light emitting end surface of the active layer is recessed between 50–300 nm inwardly from the end surfaces of the cladding layers;

wherein the bottom surface of the recessed surface is a (111) plane.

2. A semiconductor laser device comprising:

two cladding layers formed of a semiconductor crystal; and an active layer formed of a semiconductor crystal and sandwiched between the two cladding layers;

wherein a laser light is emitted from an end surface of the active layer when electricity is applied to the semiconductor laser device; and wherein at the laser light emitting end surface of the active layer is recessed between 50–300 nm inwardly from the end surfaces of the cladding layers;

wherein an insulating protection film covering the end surface of the semiconductor laser device is not in direct contact with the recessed end surface of the active layer.

* * * * *